(12) United States Patent
Matsunaga et al.

(10) Patent No.: US 10,026,786 B2
(45) Date of Patent: Jul. 17, 2018

(54) DISPLAY DEVICE

(71) Applicant: Japan Display Inc., Minato-ku (JP)

(72) Inventors: Ikuo Matsunaga, Minato-ku (JP); Kenta Kajiyama, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/404,423

(22) Filed: Jan. 12, 2017

(65) Prior Publication Data

US 2017/0236882 A1   Aug. 17, 2017

(30) Foreign Application Priority Data

Feb. 17, 2016 (JP) .................................. 2016-028207

(51) Int. Cl.
*H01L 27/32* (2006.01)

(52) U.S. Cl.
CPC ...... *H01L 27/3218* (2013.01); *H01L 27/3213* (2013.01); *H01L 27/3244* (2013.01); *H01L 2251/5392* (2013.01)

(58) Field of Classification Search
CPC ............. H01L 27/3213; H01L 27/3218; H01L 27/3244
See application file for complete search history.

(56) References Cited

U.S. PATENT DOCUMENTS

| | | | | |
|---|---|---|---|---|
| 8,921,860 B2* | 12/2014 | Kim | ............ | H01L 51/5275 257/59 |
| 9,214,498 B2* | 12/2015 | Yun | ............ | H01L 27/3213 |
| 2003/0140982 A1* | 7/2003 | Seki | ............ | B41J 25/003 141/1 |
| 2005/0073487 A1* | 4/2005 | Matsumoto | ......... | H01L 27/3276 345/76 |
| 2005/0225238 A1* | 10/2005 | Yamazaki | ............. | H01L 27/322 313/506 |
| 2005/0236950 A1* | 10/2005 | Maeda | ............... | G02F 1/133514 313/112 |
| 2006/0017371 A1* | 1/2006 | Yamada | ............... | H01L 27/3206 313/498 |
| 2006/0017671 A1* | 1/2006 | Yamada | ............... | G09G 3/3233 345/77 |
| 2007/0075305 A1* | 4/2007 | Miyata | ................ | H01L 51/5203 257/13 |

(Continued)

FOREIGN PATENT DOCUMENTS

| | | |
|---|---|---|
| JP | 2007-264354 | 10/2007 |
| JP | 2014-142641 | 8/2014 |

*Primary Examiner* — Mary Wilczewski
(74) *Attorney, Agent, or Firm* — Oblon, McClelland, Maier & Neustadt, L.L.P.

(57) ABSTRACT

A display device comprising a display region on which a plurality of subpixels are arranged. The plurality of subpixels respectively comprise a transistor, a first organic insulating film, an inorganic insulating film, an electrode, and a second organic insulating film that covers an edge part of a first region in which a pattern of the electrode is formed. The inorganic film comprises an opening in a region that overlaps with the second region in which a pattern of the electrode is not formed in a planar view. The opening is formed in a middle between the first region of a first subpixel and the first region of a second subpixel or at a point located on the side closer to the first subpixel between the first region of the first subpixel and the first region of the second subpixel.

8 Claims, 9 Drawing Sheets

(56) References Cited

U.S. PATENT DOCUMENTS

| | | | |
|---|---|---|---|
| 2007/0222367 A1* | 9/2007 | Hosoda | H01L 27/3213 313/503 |
| 2009/0261712 A1* | 10/2009 | Choi | H01L 27/3246 313/504 |
| 2010/0194268 A1* | 8/2010 | Choi | H01L 27/3213 313/504 |
| 2011/0003418 A1 | 1/2011 | Sakata et al. | |
| 2012/0080680 A1* | 4/2012 | Choi | H01L 27/3218 257/59 |
| 2012/0097954 A1* | 4/2012 | Choi | H01L 27/3213 257/59 |
| 2013/0037799 A1 | 2/2013 | Sakata et al. | |
| 2013/0082288 A1* | 4/2013 | Kim | H01L 27/3213 257/89 |
| 2013/0082592 A1* | 4/2013 | Song | H01L 51/5246 313/504 |
| 2013/0168655 A1* | 7/2013 | Yun | H01L 27/3213 257/40 |
| 2014/0209901 A1 | 7/2014 | Sakata et al. | |
| 2015/0102297 A1* | 4/2015 | Lee | G09G 3/3233 257/40 |
| 2015/0138463 A1* | 5/2015 | Jinta | H01L 51/5218 349/33 |
| 2015/0325600 A1 | 11/2015 | Sakata et al. | |
| 2016/0099294 A1* | 4/2016 | Jeong | H01L 27/3213 257/40 |
| 2016/0225797 A1 | 8/2016 | Sakata et al. | |
| 2017/0176823 A1* | 6/2017 | Akiyoshi | G02F 1/134336 |
| 2017/0236882 A1* | 8/2017 | Matsunaga | H01L 27/3218 257/40 |

\* cited by examiner

309

309

601  603
 602  604

DISPLAY DEVICE

CROSS-REFERENCE TO RELATED APPLICATION

The present application claims priority from the Japanese Application JP 2016-28207 filed on Feb. 17, 2016, the content of which is hereby incorporated by reference into this application.

BACKGROUND OF THE INVENTION

1. Field of the Invention

The present invention relates to a display device.

2. Description of the Related Art

In recent years, a display device such as an organic EL display device that uses an organic EL (Electro-Luminescent) element and a liquid crystal display device is put into practical use. However, since the organic EL element is susceptible to moisture, the organic EL element deteriorates due to moisture and a lighting defect such as a dark spot is supposed to be generated. Further, on a liquid crystal display device as well, there has been occurring a problem that a property of a thin film transistor varies by being influenced by infiltrated moisture and degeneration of a display quality occurs.

Regarding such issues, Japanese Unexamined Patent Publication No. 2007-264354 discloses that a driving circuit including a thin film transistor and the like, an insulating film to cover the driving circuit, and a planarizing film to planarize unevenness caused by a surface shape of the driving circuit are provided on an element substrate, and a sealing layer is formed at an interface between the planarizing film and the insulating film located an edge part of the planarizing film, to thereby favorably prevent an infiltration of moisture into the interface.

Further, Japanese Unexamined Patent Publication No. 2014-142641 discloses that on a display device on which a transistor including an oxide semiconductor layer is provided, when manufacturing the transistor, a heat treatment is applied to the oxide semiconductor layer, and dehydration is performed through the heat treatment.

SUMMARY OF THE INVENTION

Even if infiltration of moisture from outside the display device is prevented as in Japanese Unexamined Patent Publication No. 2007-264354, it is not possible to remove water molecules infiltrated during a manufacturing process. Further, in the case where water molecules are removed by a heat treatment in a manufacturing process as in Japanese Unexamined Patent Publication No. 2014-142641, if a metal layer and an insulating film to shut off an emission of water molecules are formed so as to cover an upper side of a layer containing water molecules, there occurs a problem such as spalling of the metal layer and the insulation film by water molecules emitted during the heat treatment.

For such a case, for example, as illustrated in FIG. 9A, a configuration could be useful where an opening (hereinafter referred to as a drain hole) for passing water molecules is provided at a part of SiN (Silicon Nitride) layer or an anode electrode 305 made of ITO (Indium Tin Oxide) formed over a planarizing film 404 containing water molecules. According to such a configuration, even if the heat treatment is performed after SiN or ITO are formed over the planarizing film 404, the water molecules contained in the planarizing film 404 is released to the outside through the drain hole 309.

Accordingly, thanks to the release of water molecules during the heat treatment the problem such as the spalling of SiN or ITO can be avoided.

However, in a vicinity area around the drain hole 309, the surface has an uneven shape, and thus when the anode electrode 305 is etched, a flow of etching liquid could be disturbed. In this case, as illustrated in FIG. 9A, on the anode electrode 305 formed on a downstream side of the drain form, a region wider than a region determined in advance is subjected to etching (hereinafter referred to as over-etching). If, after an etching treatment, a bank 407, a light emitting layer 901, and a cathode electrode 902 are formed in order, as illustrated in FIG. 9B, an edge part of the anode electrode 305 is possibly exposed out of the bank 407 and the anode electrode 305 and the cathode electrode 902 are short-circuited, to cause a display defect (903 in FIG. 9B). There will be no problem if the drain hole 309 can be formed with a sufficient distance from the edge part of the anode electrode 305, but such an arrangement becomes even harder with an image definition enhancement.

The present invention has been made in view of the above problems, and the object thereof is to provide, for an arrangement to have the drain hole, a configuration to favorably provide the drain hole with regard to the image definition enhancement.

According to one aspect of the present invention, a display device includes a display region on which a plurality of subpixels are arranged. The plurality of subpixels respectively comprise a transistor formed on an insulating surface, a first organic insulating film formed so as to cover the transistor, an inorganic insulating film provided above the first organic insulating film, an electrode formed on the first organic insulating film, and a second organic insulating film that covers an edge part of the first region in which a pattern of the electrode is formed and is provided on the first organic insulating film. The inorganic film comprises an opening in a region that overlaps with the second region in which a pattern of the electrode is not formed in a planar view. The opening is formed in a middle between the first region of a first subpixel and the first region of a second subpixel or at a point located on the side closer to the first subpixel between the first region of the first subpixel and the first region of the second subpixel. The first subpixel is located on a side of a starting point of a first direction on a plane parallel with the display device. The second subpixel is located on a side of an end point of the first direction and is adjacent to the first subpixel.

In one embodiment of the present invention, a plurality of pixels are respectively constituted by combining four of the subpixels. The subpixels are respectively arranged in a two by two matrix form in a same pixel. The opening is provided at a center of the four of the subpixels included in each of the plurality of pixels.

In one embodiment of the present invention, a plurality of pixels are respectively constituted by combining four of the subpixels. Four of the subpixels are arranged side by side in a same pixel. The opening is provided in the second region provided along the first direction.

In one embodiment of the present invention, the plurality of subpixels are arranged side by side in the first direction and are arranged side by side in the second direction that is perpendicular to the first direction, respectively. The subpixels of an nth row lined up in parallel with the first direction and the subpixels lined up in the n+1st row are arranged to be shifted from each other by one half of a width of one subpixel in the first direction. The opening is provided between first regions provided in respective ones of the subpixels lined up in the nth row and first regions provided in respective ones of the subpixels lined up in the n+1st row.

In one embodiment of the present invention, the plurality of subpixels are arranged side by side in the first direction and are arranged side by side in the second direction, respectively. The subpixels of an nth row lined up in parallel with the second direction and the subpixels lined up in the n+1st row are arranged to be shifted from each other by one half of a width of one subpixel in the second direction. The opening is provided on the side of the end point of the first direction when seen from first regions provided in the subpixels lined up in the nth row and on the side of the starting point of the first direction when seen from first regions provided in the subpixels lined up in the n+1st row in a region between first regions provided in respective adjacent ones of the subpixels of the n+1th row.

In one embodiment of the present invention, the pixels comprise an upright delta arrangement pixel that is formed to be in a shape of an equilateral triangle with one subpixel that is arranged in the nth row and two subpixels that are arranged in the n+1st row and are adjacent to each other and an inverted delta arrangement pixel that is formed to be in a shape of an inverted equilateral triangle with two subpixels that are arranged in the nth row and are adjacent to each other and one subpixel that is arranged in the n+1st row. The upright delta arrangement pixel and the inverted delta arrangement pixel are arranged alternately.

In one embodiment of the present invention, each of the subpixels comprises the first region that emits light in one of a first color, a second color and a third color. Each pixel comprises first to fourth pixels. The first pixel comprises the subpixel that is arranged in the nth row and emits light in the first color and the subpixel that is arranged in the n+1st row and emits light in the second color. The second pixel is adjacent to the first pixel in the second direction and comprises the subpixel that is arranged in the nth row and emits light in the first color and the subpixel that is arranged in the n+1st row and emits light in the third color. The third pixel comprises the subpixel that is arranged in the n+2nd row and emits light in the first color and the subpixel that is arranged in the n+3rd row and emits light in the third color. The fourth pixel is adjacent to the second pixel in the first direction and adjacent to the third pixel in the second direction, comprises the subpixel that is arranged in the n+2nd row and emits light in the first color and the subpixel that is arranged in the n+3rd row and emits light in the second color.

In one embodiment of the present invention, the first organic insulating film is in contact with the second organic insulating film via the opening.

DETAILED DESCRIPTION OF THE INVENTION

Figure 1:
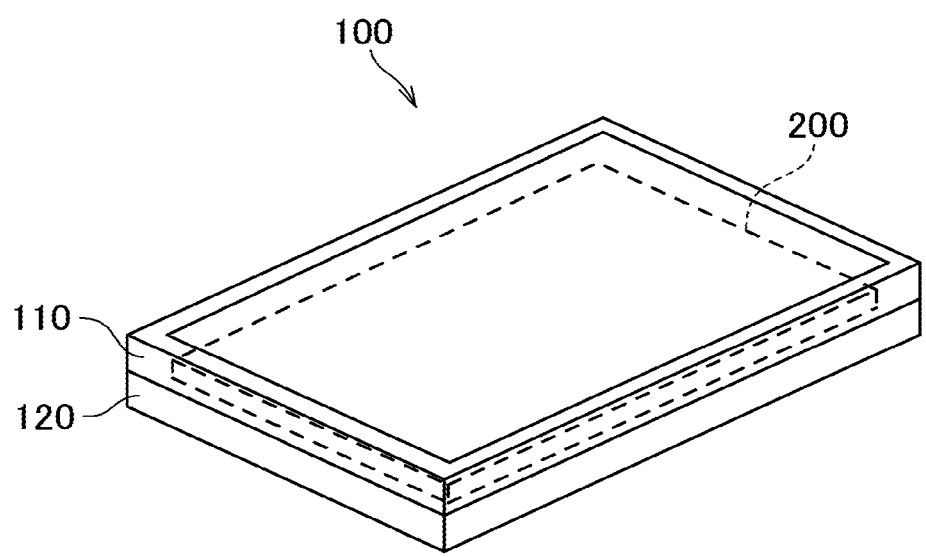
FIG. 1 schematically illustrates a display device according to an embodiment of the present invention.

Respective embodiments of the present invention are explained below with reference to the accompanying drawings. While the width, thickness, shape, and the like of each component in the drawings may be illustrated schematically as compared with the actual embodiments in order to clarify the explanation, these are merely examples and the interpretation of the present invention should not be limited thereto. Furthermore, in the specification and respective drawings, the same reference symbols may be applied to elements similar to those that have already been illustrated in another drawing and an explanation of such elements may be omitted as appropriate.

FIG. 1 schematically illustrates a display device 100 according to an embodiment of the present invention. As illustrated in this figure, the display device 100 is configured to include an organic EL panel 200 fixed so as to be held between an upper frame 110 and a lower frame 120.

Figure 2:
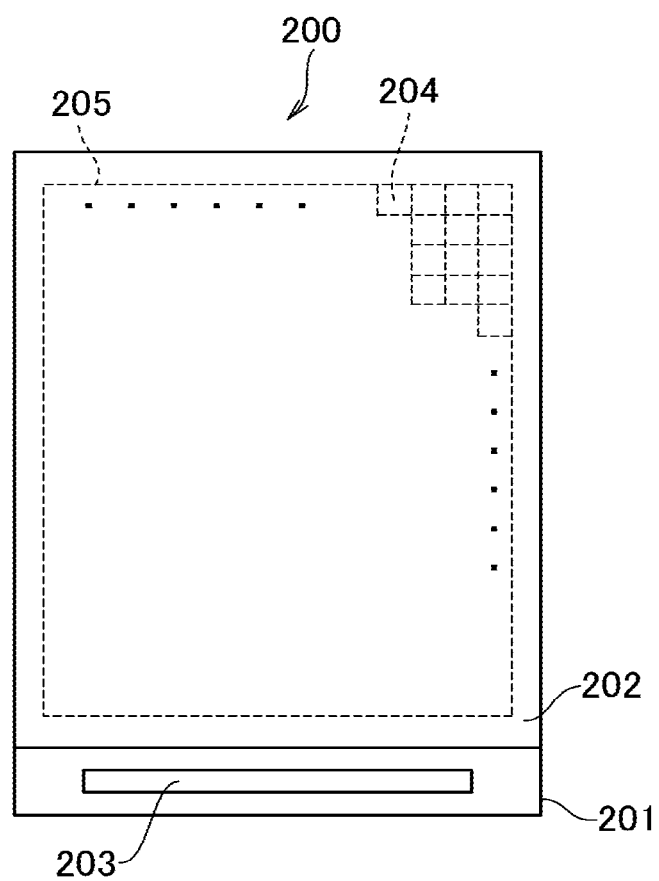
FIG. 2 illustrates a configuration of a displaying side of an organic EL panel.

FIG. 2 schematically illustrates a configuration of the organic EL panel 200 of FIG. 1. As illustrated in FIG. 2, the organic EL panel 200 includes an array substrate 201, an opposing substrate 202, and a driving IC (Integrated Circuit) 203. On the array substrate 201, self-light emitting element layer to be described later and the like are disposed, and the array substrate 201 is attached to the opposing substrate by a filler 408 (see FIG. 4).

The driving IC 203, for example, applies an electric potential for electrically connecting a source and a drain to a scan signal line of a pixel transistor 409 (see FIG. 4) disposed in correspondence with each of a plurality of subpixels that constitute one pixel 204, and at the same time emits a current that corresponds to a gradation value of the pixel 204 to a data signal line of each pixel transistor 409. The organic EL panel 200 displays a color image constituted by a plurality of subpixels 204 of a plurality of color in a display region 205 by the driving IC 203. Though it is not illustrated in particular, flexible printed circuits (FPC) to input a signal for controlling the display region 205 may be attached to the array substrate 201. In this case, the driving IC 203 may be mounted on the FPC, rather than on the array substrate 201, for minimizing a mounting region on the array substrate 201.

[First Embodiment]

Figure 3:
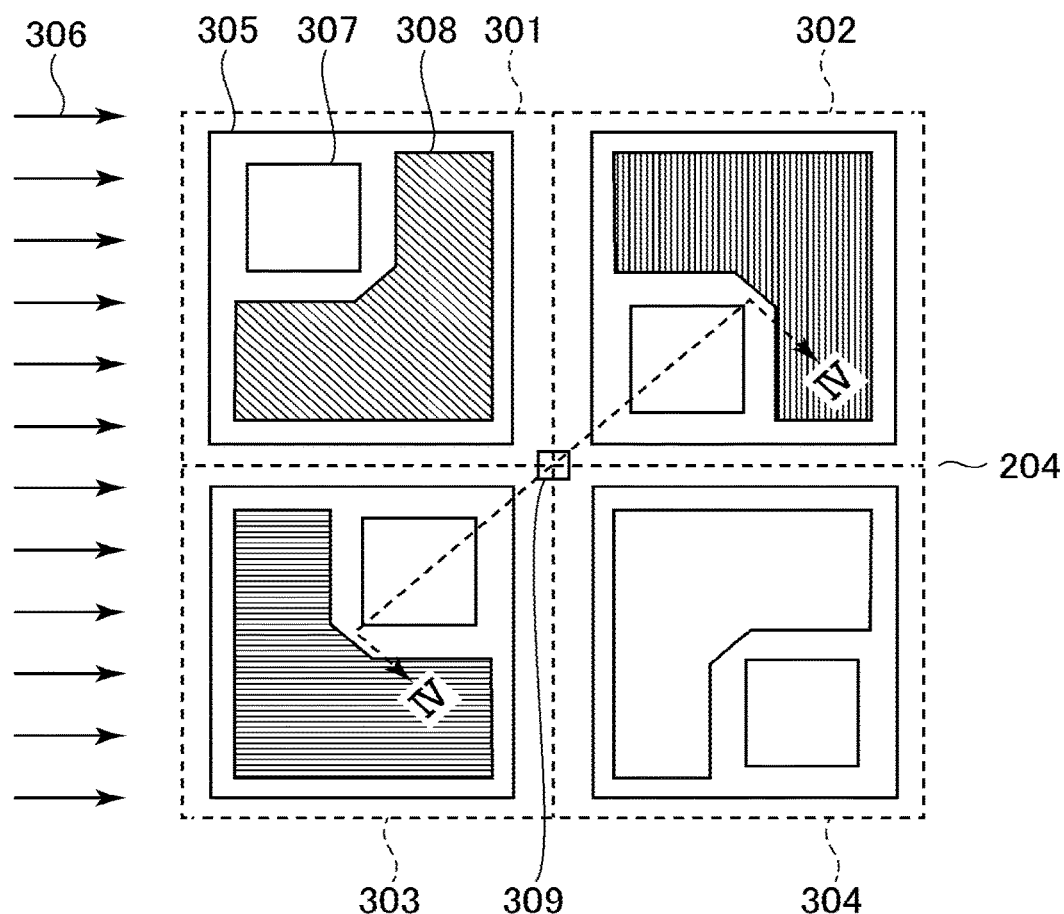
FIG. 3 schematically illustrates an example of a pixel according to a first embodiment.

FIG. 3 is an example of a view schematically illustrating the pixel 204 of FIG. 2 in the first embodiment. In this embodiment, a plurality of pixels 204 are respectively constituted by combining four subpixels. Respective subpixels are arranged in a two by two matrix form in the same pixel 204. Specifically, as illustrated in FIG. 3, each pixel 204 is configured to include subpixels 301 to 304 in two rows and two columns. Further, on each pixel 204, a green subpixel 301 that emits green light is disposed on the upper left part in the figure, a red subpixel 302 that emits red light is disposed on the upper right part, a blue subpixel 303 that emits blue light is disposed on the lower left part, and a white subpixel 304 that emits white light is disposed on the lower right part.

The anode electrode 305 in a rectangular shape is provided on each subpixel. The shape of the anode electrode 305 is formed by etching with a photolithography technique. Here, an arrow illustrated in FIG. 3 indicates a direction 306 in which the etching liquid used when the anode electrode 305 is formed by the etching flows (hereinafter referred to as a first direction).

Further, on the green subpixel 301, a contact hole 307 is provided on the upper left region inside the subpixel to connect the anode electrode 305 and a lower wiring 403. The lower wiring 403 and the contact hole 307 will be described later. Similarly, on the red subpixel 302, the contact hole 307 is provided on the lower left region inside the subpixel, on the blue subpixel 303, the contact hole 307 is provided on the upper right region inside the subpixel, and on the white subpixel 304, the contact hole 307 is provided on the lower right region inside the subpixel.

The contact hole 307 is provided on a region on which the anode electrode 305 of each subpixel is formed (hereinafter referred to as a first region). Further, a light emitting region 308 is formed on the first region in an L-shape avoiding the contact hole 307. Here, the light emitting region 308 is a region that emits light. Specifically, the light emitting region 308 included in the green subpixel 301 emits green light, the light emitting region 308 included in the red subpixel 302 emits red light, the light emitting region 308 included in the blue subpixel 303 emits blue light, and the light emitting region 308 included in the white subpixel 304 emits white light.

As seen above, since the locations of the contact holes 307 provided on respective subpixels are different, the light emitting regions 308 of respective subpixels are formed so that a long side and short side of the light emitting regions 308 of neighboring subpixels are adjacent to each other. Here, light emitted from the light emitting region 308 of one subpixel leaks into the light emitting region 308 of a neighboring subpixel, and a mixture of light of different colors occur, which causes a degradation of a display quality such as blurring of color. However, due to the above configuration, a state in which long sides of the light emitting regions 308 formed in neighboring subpixels are adjacent to each other can be avoided, and therefore the degradation of display quality can be reduced.

The drain hole 309 to release water molecules is formed in a middle between the first region of a first subpixel and the first region of a second subpixel or at a point located on the side closer to the first subpixel between the first region of the first subpixel and the first region of the second subpixel. Here, the first subpixel is located on a side of a starting point of a first direction on a plane parallel with the display device. The second subpixel is located on a side of an end point of the first direction and is adjacent to the first subpixel. The second region is a region on which no pattern of the lower wiring 403 is formed. For example, it is provided on a line whose length is the largest among lines along a direction in which the etching liquid flows when the pattern of the anode electrode 305 is formed, and at a position that is distant from the first region of the downstream side of the above line in a region where a pattern of the anode electrode 305 is opened by the etching liquid. Specifically, for example, as illustrated in FIG. 3, the drain hole 309 is provided at a center of the four subpixels included in each of the pixels 204. Note that the drain hole 309 is provided on an insulating film 406, and its details will be described with reference to FIG. 4.

Figure 4:
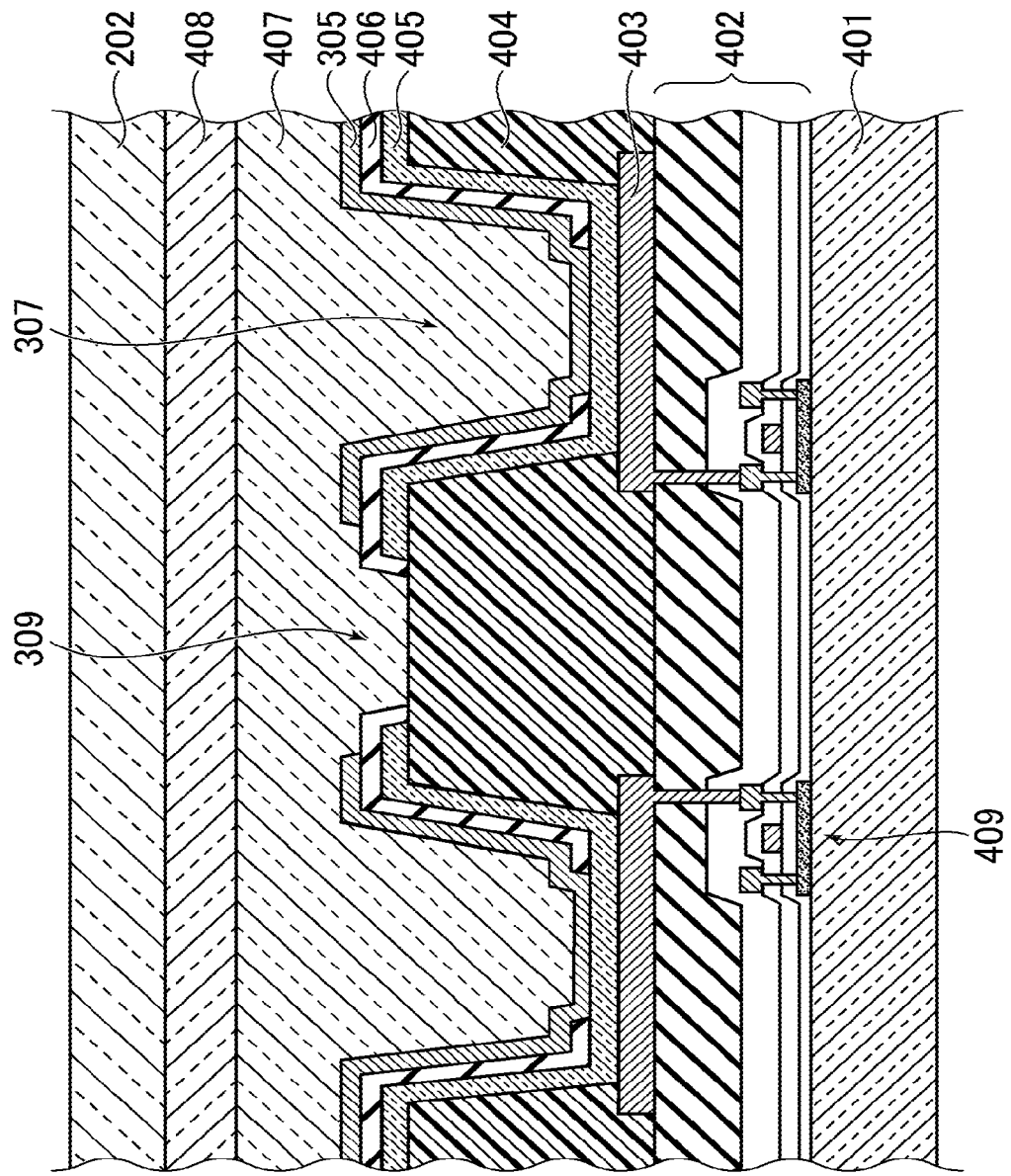
FIG. 4 illustrates a cross section of the pixel.

Subsequently, a cross sectional configuration of the contact hole 307 and the opening in FIG. 3 is explained. FIG. 4 illustrates IV-IV cross section in FIG. 3, that is, a cross section of a region ranging from the contact hole 307 provided on the subpixel that emits red light via the center of the four subpixels to the contact hole 307 provided on the subpixel that emits blue light.

As illustrated in FIG. 4, the array substrate 201 in configured to include a lower glass substrate 401, a TFT (Thin Film Transistor) circuit layer 402 formed on the lower glass substrate 401 toward the opposing substrate 202 in order, the lower wiring 403, the planarizing film 404, an ITO electrode 405, the insulating film 406, the anode electrode 305, and the bank 407. Further, the filler 408 is filled between the array substrate 201 and the opposing substrate 202.

The TFT circuit layer 402 includes a pixel transistor 409 configured to include a source wiring, a drain wiring, a gate wiring and a semiconductor layer. The detailed structure of the pixel transistor 409 is the same as the prior art, and therefore the explanation thereof is skipped. The lower wiring 403 is connected to one of the source wiring or the drain wiring of the pixel transistor 409. Note that the pixel transistor 409 is formed on an insulating surface.

The planarizing film 404 is formed so as to cover the pixel transistor 409. Further, the planarizing film 404 is formed so as to be in contact with the bank 407 via the drain hole 309. Specifically, after the planarizing film 404 is formed so as to cover the entire surfaces on the upper layer side of the lower wiring 403 and the TFT circuit layer 402, the contact hole 307 is formed by etching in a region over the lower wiring 403, and thus the planarizing film 404 is formed on the upper layer side of edge parts of the lower wiring 403 and a region in which the lower wiring 403 is not formed. Note that since the planarizing film 404 is formed with an organic material such as acrylic resin, it is formed to include water molecules during the forming process. Further, the planarizing film 404 corresponds to the first organic insulating film in the claims.

The ITO electrode 405 is formed on the lower wiring 403 and on the planarizing film 404 that is laminated on the edge parts of the lower wiring 403. On the upper layer side of the ITO electrode 405, the insulating film 406 to prevent a generation of a pin hole on the anode electrode 305 is provided.

The insulating film 406 is formed between the anode electrode 305 and the planarizing film 404. Specifically, after the insulating film 406 is formed so as to cover the ITO electrode 405, the contact hole 307 is formed on the insulating film 406 at the central part the lower layer electrode 403. Here, the insulating film 406 is formed with a material that cuts off a release of water molecules contained in the planarizing film 404, for example (e.g., an inorganic material such as SiN). Further, the insulating film 406 includes the drain hole 309 at a region that overlaps with the second region in a planer view.

The anode electrode 305 is formed on the insulating film 406, and is electrically connected to the ITO electrode 405 and the lower wiring 403 via the contact hole 307. Due to the drain hole 309, after the ITO electrode 405, the insulating film 406 and the anode electrode 305 are formed, the water molecules contained in the planarizing film 404 are released outside the planarizing film 404 through the drain hole 309 by the heat treatment.

The bank 407 is formed on the anode electrode 305 and the drain hole 309. Specifically, the bank 407 covers an edge part of the first region, and is provided on the planarizing film 404. The bank 407 may be formed with an inorganic material or organic material, and may be composed of an inorganic material layer and an organic material layer provided thereon. Note that the bank 407 corresponds to the second organic insulating film in the claims.

As seen above, according to this embodiment, the drain hole 309 is formed at a position where the anode electrode 305 is not provided on the downstream side toward which the etching liquid flows. Therefore, when etching the anode electrode 305, even if the flow of the etching liquid is disturbed in a vicinity of the drain hole 309, since the anode electrode 305 is not located on the downstream side of that flow, the over-etching of the anode electrode 305 can be prevented.

Figure 5A:
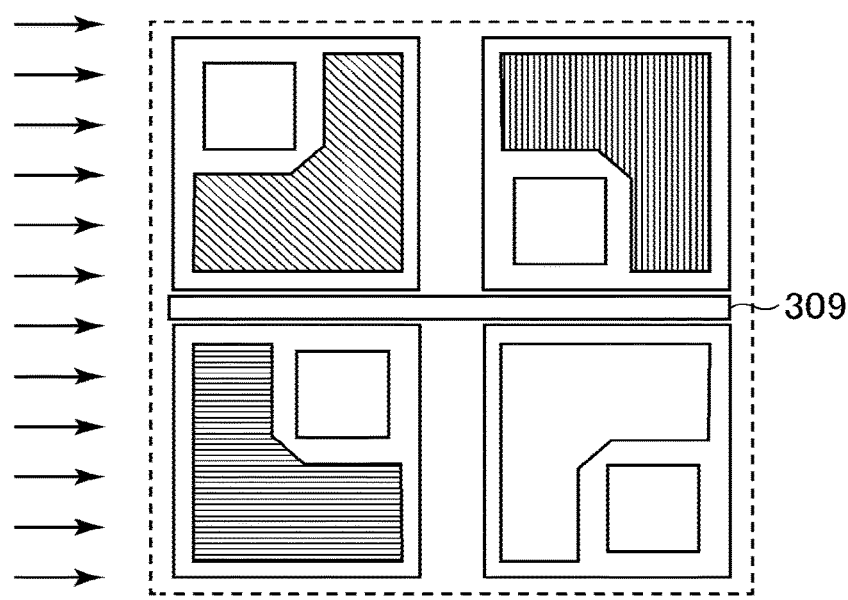
FIG. 5A illustrates an example of variation.

Although as to the above embodiment the case where the drain hole 309 to release water molecules is provided on the center of the four subpixels has been explained, the above embodiment is not limited to such a configuration. For example, the drain hole 309 may be provided on the second region that is provided along the first direction. Specifically, as illustrated in FIG. 5A, when the etching liquid flows from left to right on the figure, the drain hole 309 may be formed in a rectangular shape that has a long side along the direction in which the etching liquid flows between the subpixels that emit green light and red light and the subpixels that emit blue light and white light.

Figure 5B:
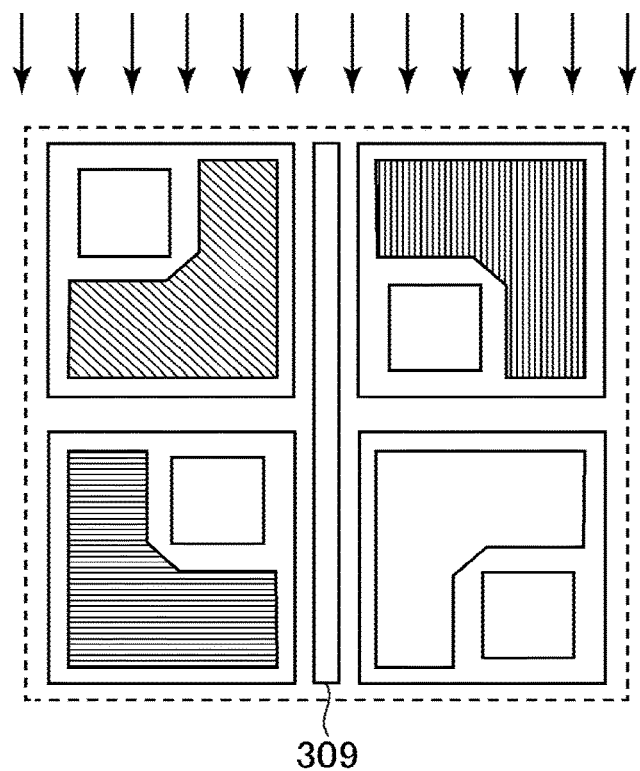
FIG. 5B illustrates an example of variation.

Further, for example, as illustrated in FIG. 5B, when the etching liquid flows from the top to the bottom on the figure, the drain hole 309 may be provided on the second region that is provided along the direction in which the etching liquid flows between a pair of the green subpixel 301 and the blue subpixel 303 and a pair of red subpixel 302 and the white subpixel 304. Even in the above configuration, the drain hole 309 can be provided in a region where the anode electrode 305 is not formed on the downstream side of the flow of the etching liquid.

The present invention is not limited to the above embodiment, and various variations are possible. As to the first embodiment, although the case where the respective subpixels are configured to be arranged in a two by two matrix form in the same pixel 204 has been explained, the arrangement layout of the subpixels included in each pixel 204 is not limited to the above. Below, second to fourth embodiments are described.

[Second Embodiment]

In the second to fourth embodiments, the arrangement layout of the anode electrode 305 and the like are different from that in the first embodiment, cross sectional configurations are the same with that in the first embodiment, the explanation thereof is omitted. Further, as in the first embodiment, although the contact hole 307 is provided on each subpixel, the explanation thereof is omitted for the brevity of the description, and the explanation is given with an assumption that the first region and the light emitting region are identical to each other.

Figure 6A:
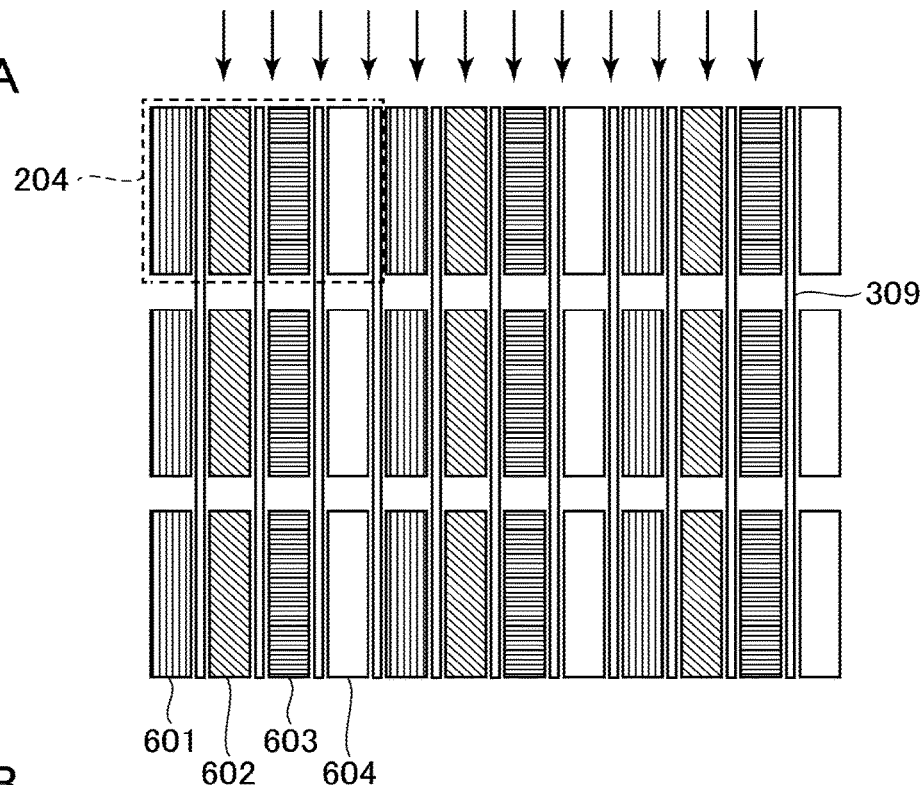
FIG. 6A schematically illustrates an example of a pixel according to a second embodiment.

In the second embodiment the plurality of pixels 204 are respectively composed by combining four subpixels. Further, four of the subpixels are arranged side by side in the same pixel 204. Specifically, for example, as illustrated in FIG. 6A, in the respective pixels 204, the red subpixel 302, the green subpixel 301, the blue subpixel 303, and the white subpixel 304 are arranged from left to right on the figure.

Further, the first region is provided on each subpixel. Specifically, the red subpixel 302 includes a red first region 601 that emits red light. The green subpixel 301 includes a green first region 602 that emits green light. The blue subpixel 303 includes a blue first region 603 that emits blue light. The white subpixel 304 includes a white first region 604 that emits white light.

The drain hole 309 is provided in the second region that is provided along the direction in which the etching liquid flows (a first direction). Specifically, for example, as illustrated in FIG. 6A, when the etching liquid flows along a direction parallel with long sides of respective subpixels, the drain hole 309 is provided between the red first region 601 and the green first region 602. Similarly, the drain hole 309 is provided between the green first region 602 and the blue first region 603. Further, the drain hole 309 is provided between the blue first region 603 and the white first region 604.

Figure 6B:
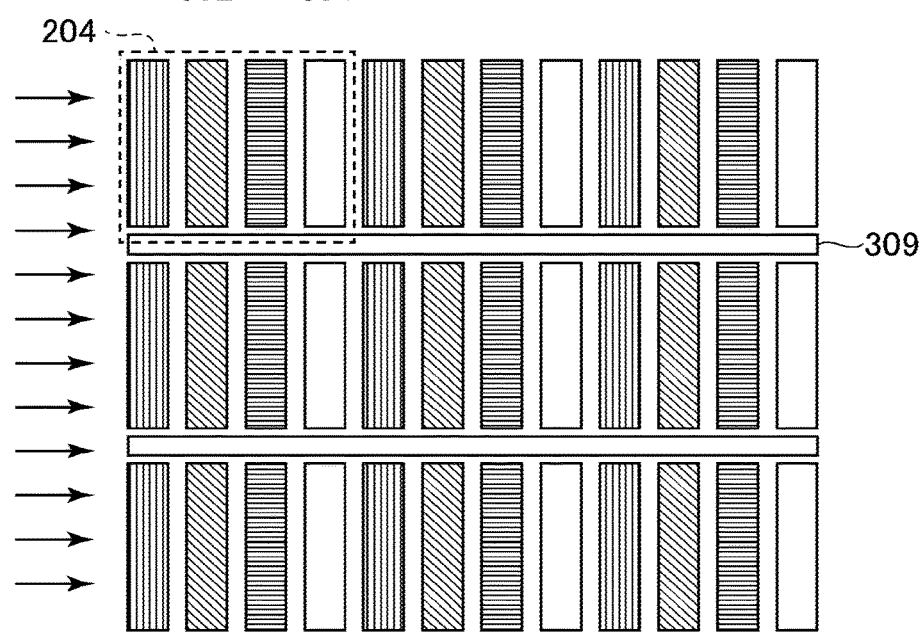
FIG. 6B schematically illustrates an example of a pixel according to the second embodiment.

Further, for example, as illustrated in FIG. 6B, when the etching liquid flows along a direction parallel with the short sides of respective subpixels, the drain hole 309 is provided between the pixel 204 arranged on the upper side of the figure and the first region of the pixel 204 adjacent thereto on the lower side. In this case as well, the drain hole 309 is arranged along a direction in which the etching liquid flows.

As seen above, in the second embodiment as well, the drain hole 309 can be provided in the region where the anode electrode 305 is not formed on the downstream side of the flow of the etching liquid. While in FIGS. 6A and 6B the shape of the drain hole 309 is rectangular, but it may have a different shape.

[Third Embodiment]

Subsequently, a third embodiment is described. In the third embodiment, the plurality of subpixels are arranged side by side in a row direction in which the etching liquid flows (a first direction) and are arranged side by side in a column direction that is perpendicular to the first direction (a second direction), respectively. Further, respective subpixels of the nth row lined up in parallel with the first direction and respective subpixels lined up in the n+1st row are arranged to be shifted from each other by one half of the width of one subpixel in the first direction. That is, in the third embodiment, respective subpixels are formed in what is called a delta arrangement.

Figure 7A:
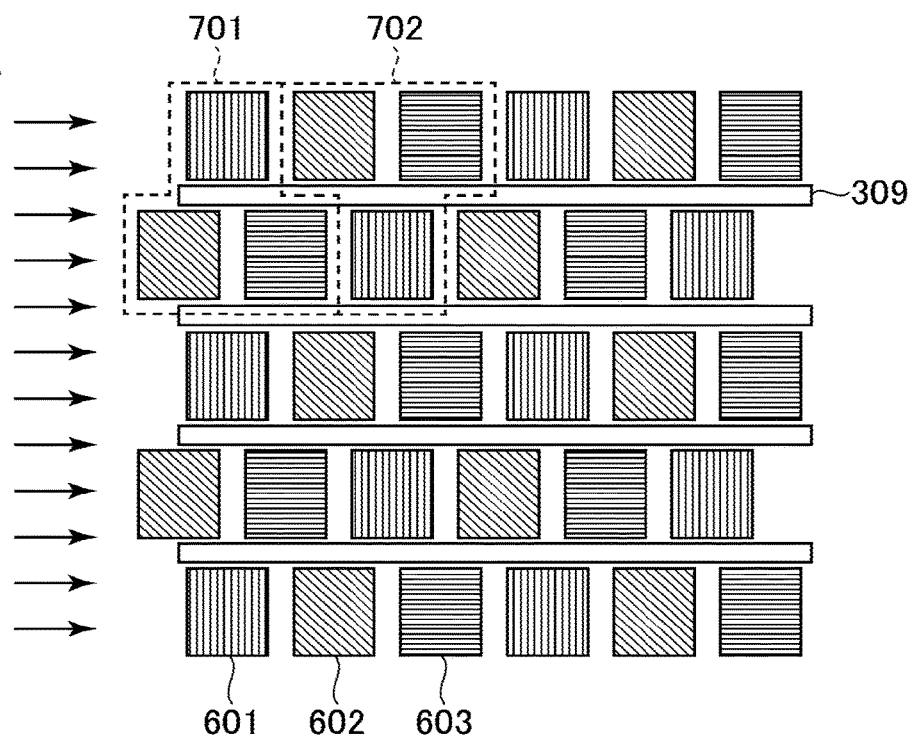
FIG. 7A schematically illustrates an example of a pixel according to a third embodiment.
Figure 7B:
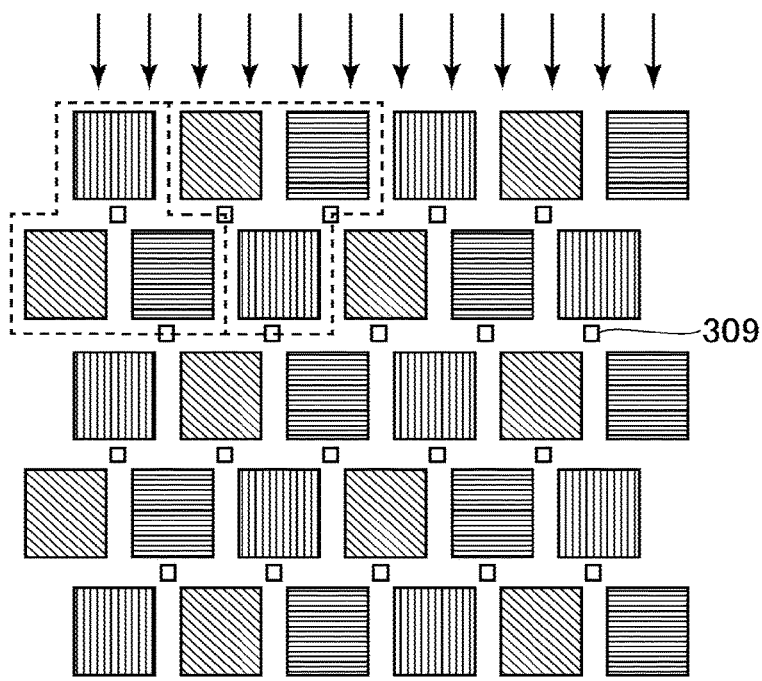
FIG. 7B schematically illustrates an example of a pixel according to the third embodiment.

Specifically, for example, as illustrated in FIGS. 7A and 7B, respective pixels 204 are configured to include an upright delta arrangement pixel 701 that is formed to be in a shape of an equilateral triangle with one subpixel that is arranged in the nth row and two adjacent subpixels that are adjacent to the one subpixel respectively and are arranged in the n+1st row and an inverted delta arrangement pixel 702 that is formed to be in a shape of an inverted equilateral triangle with two adjacent subpixels that are arranged in the nth row and one subpixel that is arranged in the n+1st row. Further, the upright delta arrangement pixel 701 and the inverted delta arrangement pixel 702 are arranged alternately.

In the upright delta arrangement pixel 701, the red subpixel 302 is formed on the upper side, the green subpixel 301 is formed on the lower left side, and the blue subpixel 303 is formed on the right left side on the figure. Further, in the inverted delta arrangement pixel 702, the green subpixel 301 is formed on the upper left side, the blue subpixel 303 is formed on the upper right side, and the red subpixel 302 is formed on the lower side on the figure.

When the etching liquid flows from left to right on the figure, as illustrated in FIG. 7A, the drain hole 309 is provided between the first regions provided on respective subpixels lined up in the nth row and the first regions provided on respective subpixels lined up in the n+1st row. Specifically, for example, the drain hole 309 is formed in a region under the red first region 601 included in the upright delta arrangement pixel 701 and above the green first region 602 and the blue first region 603, or in a region under the green first region 602 and the blue first region 603 included in the inverted delta arrangement pixel 702 and above the red first region 601, on the figure.

As seen above, the drain hole 309 can be provided in a region where the anode electrode 305 is not formed on the downstream side of the flow of the etching liquid. Although the case where the shape of the drain hole 309 is rectangular has been explained, it may have a different shape.

Further, as illustrated in FIG. 7B, in the case where the etching liquid flows from the top to the bottom on the figure, the drain hole 309 is provided on the side of the endpoint of the first direction when seen from the first region 308 provided in the subpixel lined up in the nth row and on the side of the starting point of the first direction when seen from the first region 308 provided in the subpixel lined up in the n+1 st row in a region between the first regions 308 respectively provided in adjacent subpixels of the n+1th row.

Specifically, for example, the drain hole 309 is provided at a central part of a triangle formed by the red subpixel 302, the green subpixel 301, and the blue subpixel 303 included in the upright delta arrangement pixel 701. Moreover, it is also provided at a central part of a triangle formed by the red subpixel 302, the green subpixel 301, and the blue subpixel 303 included in the inverted delta arrangement pixel 702. Further, it may be provided at a central part of a triangle formed by the blue subpixel 303 included in the upright delta arrangement pixel 701, and the red subpixel 302 and the green subpixel 301 included in the inverted delta arrangement pixel 702.

According to this embodiment, the drain hole 309 is provided on a line whose length is the largest among lines along a direction in which the etching liquid flows when forming the pattern and at a position that is located on the downstream side of the above line in the second region and is distant from the first region 308, to thereby prevent the over-etching of the anode electrode 305.

[Fourth Embodiment]

Subsequently, a fourth embodiment is described. In the fourth embodiment, as in the third embodiment, the plurality of subpixels are arranged side by side in a row direction in which the etching liquid flows (a first direction) and are arranged side by side in a column direction that is perpendicular to the first direction (a second direction), respectively. Further, respective subpixels lined up in the nth row in parallel with the second direction and respective subpixels lined up in the n+1st row are arranged to be shifted from each other by one half of the width of one subpixel in the second direction. Each subpixel is configured to include a first region that emits light in one of first, second, or third colors. Further, each pixel 204 is configured to include a first pixel 801 to a fourth pixel 804.

The first pixel 801 includes a subpixel which is arranged in the nth row and a color of light of which is the first color, and a subpixel which is arranged in the n+1st row and a color of light of which is the second color. The second pixel 802 is the pixel 204 adjacent to the first pixel 801 in a direction parallel with the second direction, and includes a subpixel which is located in the nth row and a color of light of which is the first color and a subpixel which is located in the n+1st row and a color of light of which is the third color. The third pixel 803 is the pixel 204 adjacent to the first pixel 801 in a direction parallel with the first direction, and includes a subpixel which is located in the n+2nd row and a color of light of which is the first color and a subpixel which is located in the n+3rd row and a color of light of which is the third color. The fourth pixel 804 is the pixel 204 adjacent to the second pixel 802 in a direction parallel with the first direction and adjacent to the third pixel 803 in a direction parallel with the second direction, and includes a subpixel which is located in the n+2nd row and a color of light of which is the first color and a subpixel which is located in the n+3rd row and a color of light of which is the second color. In other words, in this embodiment, respective pixels 204 are formed in what is called a pentile arrangement.

Figure 8:
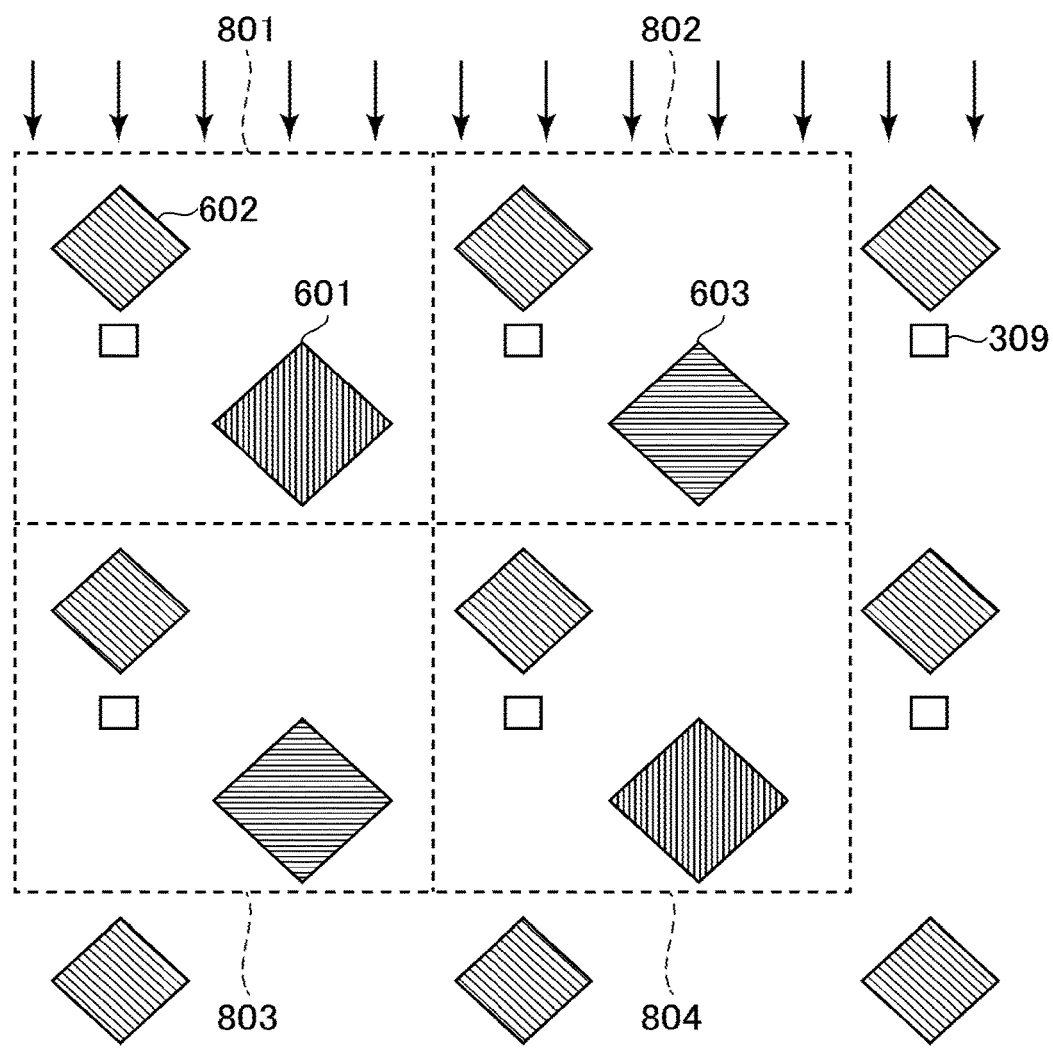
FIG. 8 schematically illustrates an example of a pixel according to a fourth embodiment.
Figure 9A:
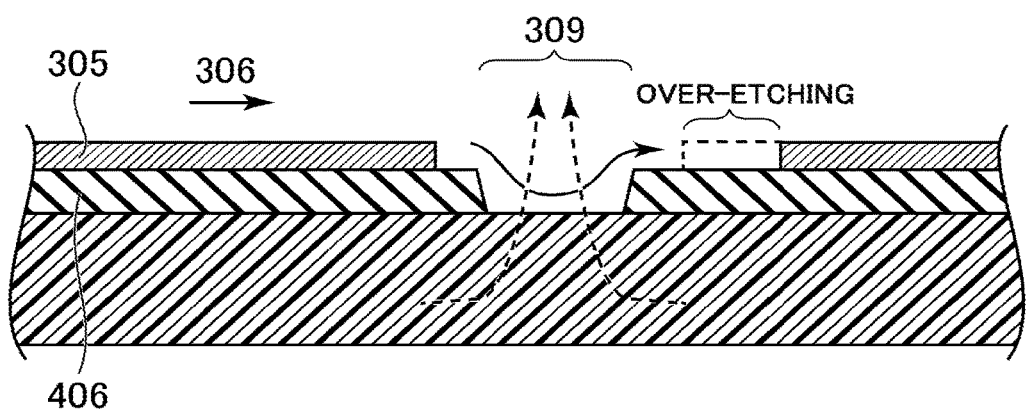
FIGS. 9A and 9B illustrate over-etching of the anode electrode.
Figure 9B:
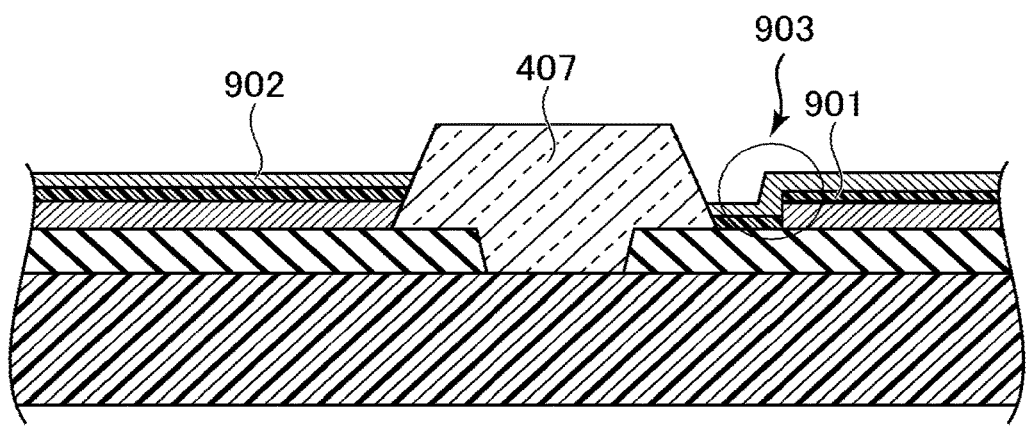

Specifically, as illustrated in FIG. 8, the first pixel 801 is configured to include the green subpixel 301 on the upper left side of the figure, and include the red subpixel 302 on the lower right side of the figure. The second pixel 802 is arranged on the right side of the first pixel 801 and configured to include the green subpixel 301 on the upper left side of the figure, and include the blue subpixel 303 on the lower right side of the figure. The third pixel 803 is arranged on the lower side of the first pixel 801 and configured to include the green subpixel 301 on the upper left side of the figure, and include the blue subpixel 303 on the lower right side of the figure. The fourth pixel 804 is arranged on the right side of the third pixel 803 and on the lower side of the second pixel 802. The fourth pixel 804 configured to include the green subpixel 301 on the upper left side of the figure, and include the red subpixel 302 on the lower right side of the figure.

The green subpixel 301 includes a green first region 602 that emits green light. Moreover, the red subpixel 302 includes a red first region 601 that emits red light. Further, the blue subpixel 303 includes a blue first region 603 that emits blue light. Note that the green first region 602 is formed to be smaller than the red first region 601 and the blue first region 603.

Further, as illustrated in FIG. 8, in the case where the etching liquid flows from the top to the bottom on the figure, the drain hole 309 is provided on the side of the endpoint of the first direction when seen from the first region provided in the subpixel lined up in the nth row and on the side of the starting point of the first direction when seen from the first region provided in the subpixel lined up in the n+1st row in a region between the first regions respectively provided in adjacent subpixels of the n+1th row.

Specifically, for example, the drain hole 309 is located under the green first region 602 included in the first pixel 801 and on the upper left side of the red first region 601. Further, the drain hole 309 is located under the green first region 602 included in the second pixel 802 and on the upper left side of the blue first region 603.

Similarly, the drain hole 309 is located under the green first region 602 included in the third pixel 803 and on the upper left side of the blue first region 603. Further, the drain hole 309 is located under the green first region 602 included in the fourth pixel 804 and on the upper left side of the red first region 601.

As seen above, the drain hole 309 is provided on a line whose length is the largest among lines along a direction in which the etching liquid flows when forming the pattern and at a position that is located on the downstream side of the above line in the second region and is distant from the first region 308, to thereby prevent the over-etching of the anode electrode 305.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
a display region on which a plurality of subpixels are arranged,
wherein the plurality of subpixels respectively comprise:
a transistor formed on an insulating surface;
a first organic insulating film formed so as to cover the transistor;
an inorganic insulating film provided above the first organic insulating film;
an electrode formed on the first organic insulating film; and
a second organic insulating film that covers an edge part of a first region in which a pattern of the electrode is formed and is provided on the first organic insulating film,
wherein the inorganic film comprises an opening in a region that overlaps with a second region in which a pattern of the electrode is not formed in a planar view,
wherein the opening is formed in a middle between the first region of a first subpixel and the first region of a second subpixel or at a point located on the side closer to the first subpixel between the first region of the first subpixel and the first region of the second subpixel,
wherein the first subpixel is located on a side of a starting point of a first direction on a plane parallel with the display device,
wherein the second subpixel is located on a side of an end point of the first direction and is adjacent to the first subpixel,
wherein a plurality of pixels are respectively constituted by combining four of the subpixels,
the subpixels are respectively arranged in a two by two matrix form in a same pixel, and
the opening is provided at a center of the four of the subpixels included in each of the plurality of pixels.
2. The display device according to claim 1,
wherein the first organic insulating film is in contact with the second organic insulating film via the opening.
3. A display device comprising:
a display region on which a plurality of subpixels are arranged,
wherein the plurality of subpixels respectively comprise:
a transistor formed on an insulating surface;
a first organic insulating film formed so as to cover the transistor;
an inorganic insulating film provided above the first organic insulating film;
an electrode formed on the first organic insulating film; and
a second organic insulating film that covers an edge part of a first region in which a pattern of the electrode is formed and is provided on the first organic insulating film,
wherein the inorganic film comprises an opening in a region that overlaps with a second region in which a pattern of the electrode is not formed in a planar view,
wherein the opening is formed in a middle between the first region of a first subpixel and the first region of a second subpixel or at a point located on the side closer to the first subpixel between the first region of the first subpixel and the first region of the second subpixel,
wherein the first subpixel is located on a side of a starting point of a first direction on a plane parallel with the display device,
wherein the second subpixel is located on a side of an end point of the first direction and is adjacent to the first subpixel,
wherein the plurality of subpixels are arranged side by side in the first direction and are arranged side by side in the second direction that is perpendicular to the first direction, respectively,
the subpixels of an nth row lined up in parallel with the first direction and the subpixels lined up in the n+1st row are arranged to be shifted from each other by one half of a width of one subpixel in the first direction, and
the opening is provided between first regions provided in respective ones of the subpixels lined up in the nth row and first regions provided in respective ones of the subpixels lined up in the n+1st row.
4. The display device according to claim 3,
wherein the pixels comprise an upright delta arrangement pixel that is formed to be in a shape of an equilateral triangle with one subpixel that is arranged in the nth row and two subpixels that are arranged in the n+1st row and are adjacent to each other and an inverted delta arrangement pixel that is formed to be in a shape of an inverted equilateral triangle with two subpixels that are arranged in the nth row and are adjacent to each other and one subpixel that is arranged in the n+1st row, and
the upright delta arrangement pixel and the inverted delta arrangement pixel are arranged alternately.
5. The display device according to claim 3,
wherein the first organic insulating film is in contact with the second organic insulating film via the opening.
6. A display device comprising:
a display region on which a plurality of subpixels are arranged,
wherein the plurality of subpixels respectively comprise:
a transistor formed on an insulating surface;
a first organic insulating film formed so as to cover the transistor;
an inorganic insulating film provided above the first organic insulating film;
an electrode formed on the first organic insulating film; and
a second organic insulating film that covers an edge part of a first region in which a pattern of the electrode is formed and is provided on the first organic insulating film,
wherein the inorganic film comprises an opening in a region that overlaps with a second region in which a pattern of the electrode is not formed in a planar view,
wherein the opening is formed in a middle between the first region of a first subpixel and the first region of a second subpixel or at a point located on the side closer to the first subpixel between the first region of the first subpixel and the first region of the second subpixel,
wherein the first subpixel is located on a side of a starting point of a first direction on a plane parallel with the display device,
wherein the second subpixel is located on a side of an end point of the first direction and is adjacent to the first subpixel,
wherein the plurality of subpixels are arranged side by side in the first direction and are arranged side by side in the second direction, respectively,
the subpixels of an nth row lined up in parallel with the second direction and the subpixels lined up in the n+1st row are arranged to be shifted from each other by one half of a width of one subpixel in the second direction, and the opening is provided on the side of the end point of the first direction when seen from first regions provided in the subpixels lined up in the nth row and on the side of the starting point of the first direction when seen from first regions provided in the subpixels lined up in the n+1st row in a region between first regions provided in respective adjacent ones of the subpixels of the n+1th row.

7. The display device according to claim 6, wherein each of the subpixels comprises the first region that emits light in one of a first color, a second color and a third color, each pixel comprises first to fourth pixels, the first pixel comprises the subpixel that is arranged in the nth row and emits light in the first color and the subpixel that is arranged in the n+1st row and emits light in the second color, the second pixel is adjacent to the first pixel in the second direction and comprises the subpixel that is arranged in the nth row and emits light in the first color and the subpixel that is arranged in the n+1st row and emits light in the third color, the third pixel comprises the subpixel that is arranged in the n+2nd row and emits light in the first color and the subpixel that is arranged in the n+3rd row and emits light in the third color, and the fourth pixel is adjacent to the second pixel in the first direction and adjacent to the third pixel in the second direction, comprises the subpixel that is arranged in the n+2nd row and emits light in the first color and the subpixel that is arranged in the n+3rd row and emits light in the second color.

8. The display device according to claim 6, wherein the first organic insulating film is in contact with the second organic insulating film via the opening.

\* \* \* \* \*